United States Patent
Wurzinger

(10) Patent No.: US 10,404,040 B2
(45) Date of Patent: Sep. 3, 2019

(54) FILTER ARRANGEMENT

(71) Applicant: InTiCa Systems AG, Passau (DE)

(72) Inventor: Mathias Wurzinger, Ringelai (DE)

(73) Assignee: InTiCa Systems AG, Passau (DE)

( * ) Notice: Subject to any disclaimer, the term of this patent is extended or adjusted under 35 U.S.C. 154(b) by 0 days.

(21) Appl. No.: 15/842,043

(22) Filed: Dec. 14, 2017

(65) Prior Publication Data
US 2018/0198261 A1    Jul. 12, 2018

(30) Foreign Application Priority Data

Jan. 10, 2017    (DE) .................. 10 2017 100 381

(51) Int. Cl.
| | |
|---|---|
| *H02B 1/20* | (2006.01) |
| *H02M 7/00* | (2006.01) |
| *H03H 1/00* | (2006.01) |
| *H02M 1/44* | (2007.01) |

(52) U.S. Cl.
CPC ............. *H02B 1/20* (2013.01); *H02M 1/44* (2013.01); *H02M 7/003* (2013.01); *H03H 1/0007* (2013.01)

(58) Field of Classification Search
CPC .................. H02B 1/20; H03H 1/0007
See application file for complete search history.

(56) References Cited

U.S. PATENT DOCUMENTS

| | | | | |
|---|---|---|---|---|
| 4,430,522 A | * | 2/1984 | Bader ................ | H02G 5/005 174/72 B |
| 5,421,751 A | | 6/1995 | Bennett et al. | |
| 5,875,091 A | * | 2/1999 | Rieken ............. | H01R 13/6625 361/328 |
| 6,717,421 B1 | * | 4/2004 | Kazama ........... | G01R 1/06716 174/261 |
| 9,985,403 B1 | * | 5/2018 | Herring ................ | H01R 41/00 |
| 2005/0277336 A1 | | 12/2005 | Yang | |
| 2009/0047843 A1 | * | 2/2009 | Okamoto ............ | H01L 24/72 439/700 |
| 2011/0261508 A1 | | 10/2011 | Ross et al. | |

FOREIGN PATENT DOCUMENTS

| | | | | |
|---|---|---|---|---|
| CN | 103247984 A | 8/2013 | | |
| DE | 19507790 C1 | 3/1996 | | |
| DE | 102005017849 A1 | * | 10/2006 | ............. H01L 24/72 |
| DE | 202013104784 U1 | 1/2014 | | |
| DE | 202016104468 U1 | 8/2016 | | |

\* cited by examiner

*Primary Examiner* — Robert J Hoffberg
(74) *Attorney, Agent, or Firm* — Welsh Flazman & Gitler

(57) ABSTRACT

The invention relates to a filter arrangement having a first busbar, a second busbar and a carrier element, on which at least one electrical filter component is arranged, which is electrically connected to the busbars, wherein the electrical connection of the at least one electrical filter component to at least one of these busbars is realized by mechanical clamping of the carrier element between the first and second busbar.

10 Claims, 5 Drawing Sheets

US 10,404,040 B2

FILTER ARRANGEMENT

BACKGROUND OF THE INVENTION

The invention relates to a filter arrangement and a method for producing a filter arrangement.

Electric or electronic filters for interference suppression of electrical systems and installations are basically known. In particular, filters are known which in a direct current network filter out high-frequency signals which are coupled into direct current paths, in order to meet the existing requirements with regard to electromagnetic compatibility (EMC) of the electrical system or of the installation (so-called EMC filters).

In particular in electrically driven vehicles, the problem exists that high electric currents must be transmitted on busbars between the energy storage (e.g. battery unit) and the electric motor (e.g. currents up to 500 A). Therefore, the busbars must have a considerable cross-section (e.g. in the $cm^2$ range) in order to prevent an excessive heating of the busbars. Electrical components, in particular capacitors, must be connected to these busbars in order to enable the filtering out of the high-frequency interferences. The transition impedances (ohmic resistances, parasitic inductances) arising when connecting the capacitors must, in addition, be as small as possible.

Hitherto, the connecting of the electrical filter components (in particular capacitors) is performed by a welding of the connection regions of the capacitors on the busbars, in particular on busbar regions which have previously been prepared through suitable material processing (e.g. drilling or respectively milling) for a welding-on process, in order to only enable a fusing of the thinly formed connection regions with the busbar. This is, on the one hand, time-consuming and cost-intensive, but on the other hand error-prone, because the quality of the electrical contact depends significantly on the quality of the welded connection, which is subject to considerable variations.

Proceeding herefrom, it is an object of the invention to provide a filter arrangement which is able to be produced in a time- and cost-efficient manner and, moreover, enables a reliable electrical contacting of the filter components.

SUMMARY OF THE INVENTION

According to a first aspect, the invention relates to a filter arrangement including a first busbar, a second busbar, and a carrier element, on which at least one filter component, in particular an electrical capacitor, is arranged. The one filter component is electrically connected to the busbars. The electrical connection of the at least one electrical filter component to at least one of these busbars takes place through mechanical clamping of the carrier element between the first and second busbar.

The filter arrangement according to the invention offers the key advantage that the electrical connection between busbar and filter component can be produced simply and at a favorable cost through the mechanical mounting. Thereby, in particular, a welding of the connection regions of the filter components on the busbars can be avoided. This leads, on the one hand, to a reduction of contacting faults, and on the other hand to cost advantages in the production of the filter arrangement.

In a preferred example embodiment, the busbars run parallel to one another and are arranged one above the other. Thereby, a carrier element, arranged between the busbars, can be fixed by bracing the busbars against one another, and the electrical contacting between busbar and filter component is realized by pressing of contact sections against each other during mechanical bracing.

In a preferred example embodiment, the carrier element is configured strip-shaped. It can have, in particular, a width (measured in the direction of the longitudinal axis of the busbars) which is smaller than the length (measured transversely to the longitudinal axis of the busbars) of the carrier element. The strip-shaped carrier element can be arranged between the busbars in order to be braced mechanically between these.

In a preferred example embodiment, a longitudinal axis of the carrier element runs transversely, in particular perpendicularly to the longitudinal axis of the busbars. In the region in which the busbars and the carrier element intersect, the electrical contacting of the busbars may occur for the purpose of the electrical coupling with the at least one filter component.

In a preferred example embodiment, the carrier element protrudes laterally on both sides of the busbars and on the protruding regions respectively a filter component, in particular an electrical capacitor, is provided. The protruding regions serve thereby as connection regions for the filter components. Thereby, the electrical lines between busbar and filter component can be kept short.

In a preferred example embodiment, a first filter component, in particular an electrical capacitor, couples the first busbar with a component having an electrical reference potential. The electrical reference potential can have, in particular, earth potential. Thereby, high-frequency interferences present on the first busbar can be diverted via the filter component and thereby filtered out.

In a preferred example embodiment, a second filter component, in particular an electrical capacitor, couples the second busbar with a component having an electrical reference potential. The electrical reference potential can have, in particular, earth potential. Thereby, high-frequency interferences present on the second busbar can be diverted via the filter component and thereby filtered out.

Preferably, the first and second busbar are coupled with identically dimensioned filter components. These are preferably arranged symmetrically to one another, in particular mirror-symmetrically to the longitudinal axis of the busbars. Thereby, an interference suppression of both busbars against common-mode signals (common-mode filtering) can be obtained.

In a preferred example embodiment, the electrical connection between the busbar and a conducting region arranged on the carrier element is achieved via a contact section (contact spring) having at least one contact region configured in a spring-like manner. This contact region configured in a spring-like manner can be at least partially elastically deformed or respectively compressed when clamping the carrier element between the busbars. Thereby, an improved electrical contacting of the busbars can be achieved.

In a preferred example embodiment, the contact section has a plurality of contact tongues. The contact tongues can protrude at least partially upwards or else upwards and downwards in relation to a central plane of the contact section. The simultaneous upward and downward protruding of the contact tongues is achieved for example in that these are preferably at least partially turned along their longitudinal axis, so that edge regions protrude upwards and downwards with respect to the central plane of the contact section. The turning of the contact tongues, for example before the clamping between the carrier element and the busbar, can be between 30° and 60°, for example between 40° and 50°, in particular approximately 45°. This turning angle can then be at least partially reduced through the clamping between the carrier element and the busbar. Alternatively, the contact section can also have different elastically deformable contact regions, for example in the form of a contact region in the shape of a spiral spring.

In a preferred example embodiment, at least one spacer is provided between the carrier element and the busbar in the region of the contact section, the spacer limiting the deformation of the contact region configured in a spring-like manner. Thereby, it is achieved that the contact region configured in a spring-like manner deforms only to a certain extent, independently of the force by which the busbars are braced against one another, and can not be pressed completely against the carrier element.

In a preferred example embodiment, a contact section is provided at the carrier element at two carrier element sides lying opposite one another. Thereby, by means of the clamping of the carrier element, a simultaneous electrical contacting of the respective busbars can take place, for example a first busbar is electrically connected by means of a contact section on the underside, and a second busbar is electrically connected by means of a contact section on the upper side.

In a preferred example embodiment, the carrier element is a printed circuit board comprising an electrically insulating printed circuit board carrier and a plurality of electrically conductive conductor path regions. Via the conductor path regions, the electrical contacting is obtained between busbar and capacitor or respectively between capacitor and a component having reference potential (in particular earth potential). The conductor path regions may extend over the entire width or substantially the entire width of the printed circuit board (in particular >80%). Thereby, an optimized diverting of the interferences is achieved.

In a preferred example embodiment, the carrier element has a carrier of an electrically non-conducting material, and punched sheet metal parts arranged thereon. The punched sheet metal parts serve here for the respective electrical contacting of the filter component toward the busbar and toward the component lying at reference potential. Thereby, the production costs of the filter arrangement can be further reduced.

In a preferred example embodiment, the contact region, configured in a spring-like manner, is provided in one piece on a punched sheet metal part connecting the busbar to the filter component. In other words, the contact region, configured in a spring-like manner, forms an integral part of a punched sheet metal part situated for contacting between busbar and filter component. Thereby, a soldering of a contact element to the punched sheet metal part can be avoided, which leads to low transition resistances and thereby to improved filter characteristics.

In a preferred example embodiment, the filter arrangement comprises a plurality of carrier elements, the carrier elements being spaced from one another along the busbars, each carrier element comprising at least one filter component. Between these carrier elements a choke can be provided, which is formed by a ring-shaped magnet core or respectively by a wound strip core, in particular a nanocrystalline strip core. The choke can have in particular an inner opening which is adapted to the cross-section of the busbars, clamped against one another, such that the choke is able to be slid onto the busbars. Through the inductive effect of the magnet core on the busbar, the effect of a choke is achieved.

According to a further aspect, the invention relates to a method for producing a filter arrangement comprising a first busbar and a second busbar and a carrier element. At least one electrical filter component is arranged on the carrier element and the electrical filter component is electrically connected to at least one of the busbars. The at least one electrical filter component is electrically connected to at least one of these busbars through mechanical clamping of the carrier element between the first and second busbars.

"Filter component" in the sense of the present invention is understood as any electrical component which can be used for the interference suppression of busbars. Filter components can be, in particular, capacitors, but can also be inductances or electrical resistors.

The expressions "approximately", "substantially" or "about" in the sense of the invention mean deviations from the respectively exact value by +/−10%, preferably by +/−5% and/or deviations in the form of changes which are insignificant for function.

Further developments, advantages and application possibilities of the invention will also emerge from the following description of example embodiments and from the figures. Here, all the features which are described and/or represented visually are basically a subject of the invention individually or in any desired combination, irrespective of their grouping in the claims or in their back references. Also, the content of the claims is made a constituent part of the description.

BRIEF DESCRIPTION OF THE DRAWINGS

The invention is explained further in the following with the aid of the figures in example embodiments. There are shown.

DETAILED DESCRIPTION OF THE INVENTION

Figure 1:
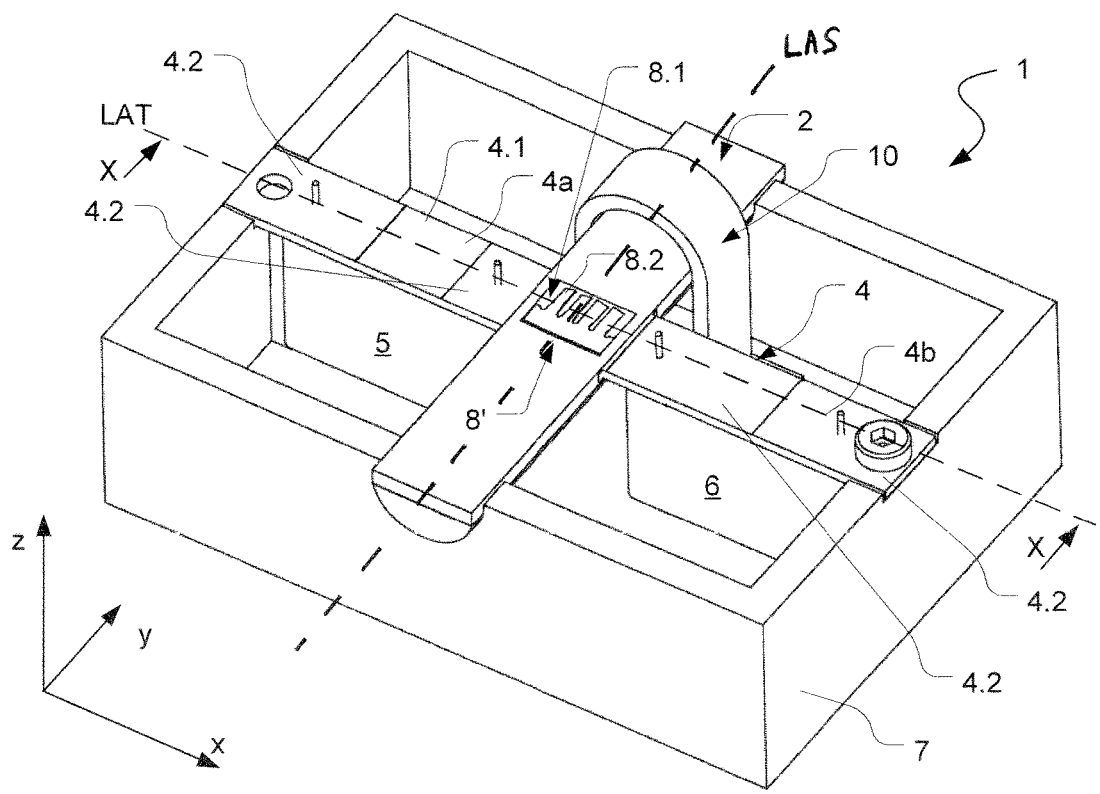
FIG. 1 by way of example, a first embodiment of a filter arrangement in a perspective view.

FIGS. 1 to 5 show a first example embodiment of a filter arrangement 1 in different views. The following description of the filter arrangement 1 is made with reference to a Cartesian coordinate system with axes standing perpendicularly to one another, namely an x-axis, a y-axis and a z-axis. The filter arrangement 1 comprises a busbar pair with a first busbar 2 and a second busbar 3. In the illustration according to FIG. 1, only the first busbar 2 is shown. It shall be understood that more than two busbars can be provided for the formation of the filter arrangement 1.

The busbars 2, 3 of the filter arrangement 1 build, for example, a positive and a negative electrical conductor, which connects an energy storage unit, for example an electrical battery, to an electrical consumer, for example an electric motor. In the shown example embodiment, the busbars 2, 3 are arranged one above the other in z-direction and run with their longitudinal axes (LAS) parallel to one another in y-direction. Preferably, the busbars 2, 3 are configured so as to be semicircular in cross-section and are arranged with their flat sides spaced apart, facing one another, so that the busbars 2, 3, arranged one above the other, form a busbar pair which is circular in cross-section. The busbars 2, 3 may be partially spaced by suitable insulating materials.

For interference suppression of the busbars 2, 3, the filter arrangement 1 comprises a carrier element 4 on which at least one capacitor 5, 6 is provided. In the shown example embodiment, the carrier element 4 is configured in a strip-like manner, wherein the width of the carrier element 4 is smaller than the length of the carrier element 4 along its longitudinal axis (LAT). This carrier element 4 is arranged between the two busbars 2, 3 such that the longitudinal axis (LAT) of the carrier element 4 runs transversely, in particular perpendicular, to the longitudinal axis (LAS) of the busbars 2, 3 (in x-direction in the shown example embodiment). The fixing of the carrier element 4 between the busbars 2, 3 is realized by mechanical clamping of the carrier element 4. Here, an upper side, of flat configuration, of the lower first busbar 2 abuts with respect to the underside of the carrier element 4, and an underside, of flat configuration, of the upper second busbar 3 abuts with respect to the upper side of the carrier element 4.

The carrier element 4 is arranged with respect to the first and second busbar 2, 3 such that two carrier element regions 4a, 4b, of identical or substantially identical length, protrude from the busbar pair towards different sides. By way of example, the first carrier element region 4a protrudes towards the left side, the second carrier element region 4b protrudes towards the right side. The first capacitor 5 is provided here at the first carrier element region 4a, and the second capacitor 6 is provided at the second carrier element region 4b. Thereby, a filter arrangement 1 is achieved which is mirror-symmetrical or substantially mirror-symmetrical in relation to the longitudinal axis (LAS) of the busbars 2, 3. As shown in the example embodiment according to FIG. 1, the capacitors 5, 6 can be arranged hanging, i.e. protruding downwards in the direction of the first busbar 2, on the carrier element 4.

In order to couple the busbars 2, 3 electrically to the capacitors 5, 6 for the purpose of interference suppression of the busbars 2, 3, electrically conductive regions are provided respectively on the upper side 4' and on the underside 4" of the carrier element 4. In the example embodiment shown in FIGS. 1 to 5, the carrier element 4 is formed by a printed circuit board 4.1 on which a plurality of conductor path regions 4.2 are provided on the upper side 4' and on the underside 4".

Figure 3:
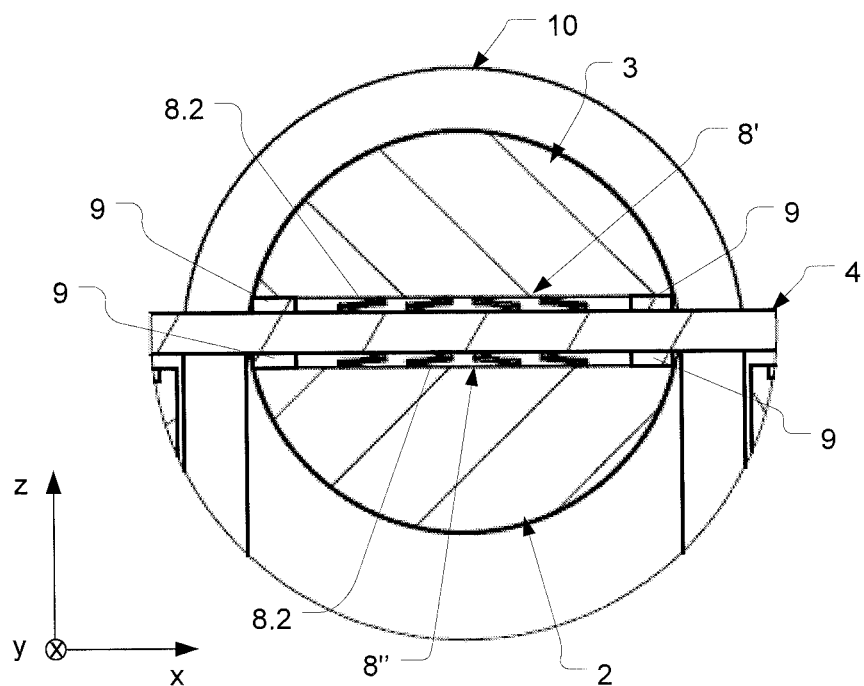
FIG. 3 by way of example, the clamping region, marked by the dashed circle in FIG. 2, between busbar pair and carrier element, in a detail illustration.
Figure 4:
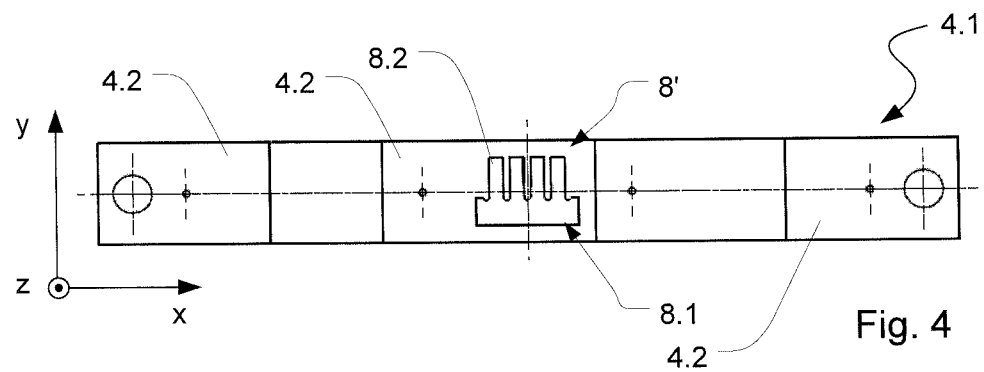
FIG. 4 by way of example, an illustration of the upper side of the carrier element with capacitors provided thereon.
Figure 5:
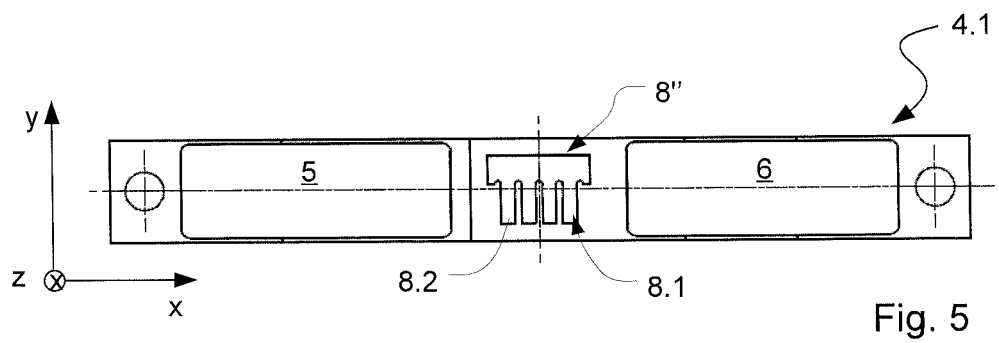
FIG. 5 by way of example, an illustration of the underside of the carrier element with capacitors provided thereon.

As can be seen in particular in FIGS. 3 to 5, a contact section 8', 8" can be provided respectively on the upper side 4' and on the underside 4" of the carrier element 4. This contact section 8', 8" is electrically coupled respectively via conductor path regions 4.2 to the capacitor 5, 6. Thereby, an electrical connection can be formed between the busbars 2, 3 and the capacitors 5, 6. Thus, for example, a contact section 8' is provided on the upper side 4' of the carrier element 4, by means of which the second busbar 3 is electrically connected to the first capacitor 5. On the underside 4" of the carrier element 4 a contact section 8" is provided by means of which the first busbar 2 is electrically connected to the second capacitor 6. It shall be understood that also the reverse connecting possibility exists.

The contact sections 8', 8" have a contact region 8.1 configured in a spring-like manner. In the shown example embodiment, the contact region 8.1 is configured in a comb-like manner with a plurality of contact tongues 8.2 protruding upwards or else upwards and downwards. These contact tongues 8.2 are deformed elastically or respectively deformed in the direction of a horizontal alignment on the clamping of the carrier element 4 between the two busbars 2, 3, so that the contact tongues 8.2 are pressed, through the restoring forces, against the busbars 2, 3. Thereby, a low-ohmic transition resistance occurs between the conductor path regions 4.2 and the contact sections 8', 8", and thereby a low-ohmic connection of the capacitors 5, 6 to the busbars 2, 3 is achieved, namely without using of a soldered or welded connection. Alternatively to the contact tongues, other contact region variants configured in a spring-like manner are also possible, for example a contact region 8.1 with contact elements in the manner of a spiral spring.

In the case of using a printed circuit board 8.1, the contact section 8', 8" can be formed, for example, by a contact spring element soldered onto a conductor path region 4.2. Alternatively, it is possible that the contact spring element is merely placed loosely onto the conductor path region 4.2 or is glued thereto. The electrical contacting between the conductor path region 4.2 and the respective busbar 2, 3 is realized by the contact section 8', 8" such that a contact region 8.1, configured in a spring-like manner, is used, which electrically contacts the conductor path region 4.2 as well as the busbar 2, 3, for example, through upwardly and downwardly protruding contact tongues 8.2. The protruding upwards and downwards can be achieved in particular by a turning through 45° or substantially 45° around the longitudinal axis of the contact tongues 8.2.

Figure 2:
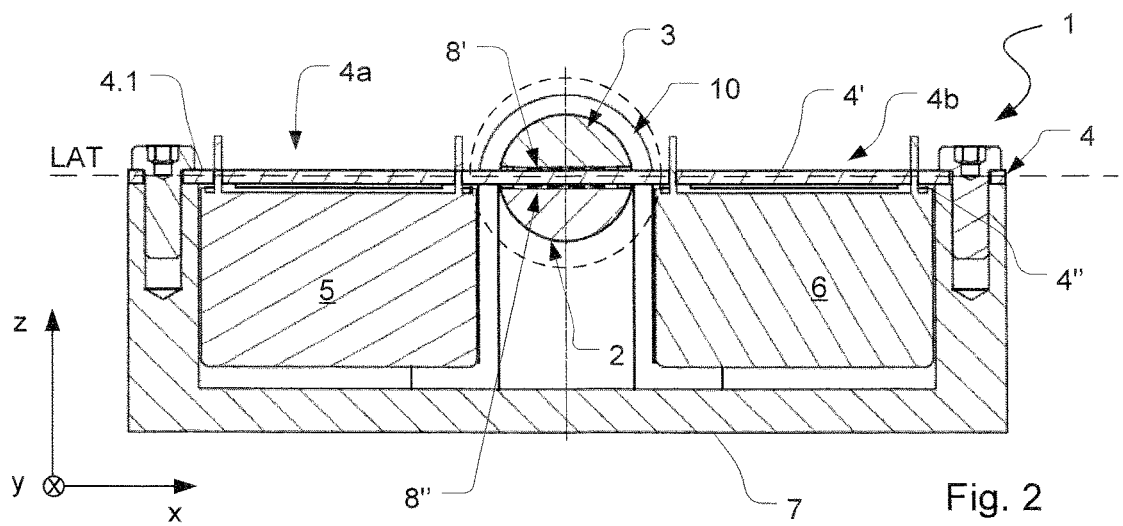
FIG. 2 by way of example, a sectional illustration of the filter arrangement along the section line X-X shown in FIG. 1.

For diverting the interferences, the capacitors 5, 6, as can be seen in particular in FIG. 2, are electrically coupled, by a connection region facing away from the busbars 2, 3, to a component 7 which is formed, for example, by a housing made of an electrically conductive material. This component 7, for example, has reference potential, in particular earth potential. The electrical connection to the component 7 can be realized by a screw connection (or similar) and a conductor path region 4.2, which electrically connects the connection region of the capacitor 5, 6 to the component 7. The screw connection can, for example, also cause the fixing of the free end of the carrier element 4. As shown in FIGS. 1 and 2, one or more brackets 10 can be used in order to fix the busbars 2, 3.

As can be seen in particular in FIG. 3, the contact tongues 8.2 can be turned at least partially with respect to the x-y plane, and namely in particular about a rotation axis running parallel to the y-axis. Thereby, edge regions of the contact tongues 8.2 protrude upwards with respect to the remaining regions of the contact tongues 8.2, whereby when clamping the busbars 2, 3 against one another, an abutting of the busbars 2, 3 at these edge regions is achieved. Thereby, the electrical contact between the contact sections 8, 8' and the busbars 2, 3 is furthermore improved.

In the region of the contact section 8', 8", a spacer 9 can be provided. This spacer 9 can, for example, run in a frame-like manner around the respective contact section 8', 8" or else can merely be provided pointwise or partially around the contact section 8', 8". The height of the spacer 9 can be selected such that the deformation of the contact tongues 8.2 is limited, i.e. the contact tongues 8.2 are not completely pressed against the carrier element 4 through the clamping of the busbars 2, 3, but rather remain at least partially spaced apart therefrom (see FIG. 3).

In case that the component 7 is formed by a housing configured in a cup-like manner, this housing can be cast with a suitable casting material, for example, an epoxy resin or similar. Thereby, the capacitors 5, 6 and, if applicable, the carrier element regions 4a, 4b can be protected against moisture and vibrations.

FIGS. 6 to 10 show a further example embodiment of a filter arrangement 1 according to the invention. Here, the illustration according to FIG. 6 corresponds to the illustration in FIG. 1, the illustration according to FIG. 7 corresponds to the illustration in FIG. 2, etc. Only the differences of the second example embodiment compared to the first example embodiment are explained below. Otherwise, the previous statements also apply to the second example embodiment.

The essential difference between the first and second example embodiments lies in the configuration of the carrier element 4. In the second example embodiment, the carrier element 4 is formed by a carrier 4.3 of an electrically non-conducting material on which a plurality of punched sheet metal parts 4.4 (also designated as a punched grid) are arranged. Here "punched sheet metal parts" are understood as any sheet metal parts which are produced by punching or else by other material processing, for example laser cutting. These punched sheet metal parts 4.4 are arranged on the carrier 4.3 by suitable connecting techniques. Thus, for example, the punched sheet metal parts 4.4 can be pushed in or respectively inserted into recesses provided on the carrier. Fixing by injecting around, by casting or bonding is also conceivable.

Figure 6:
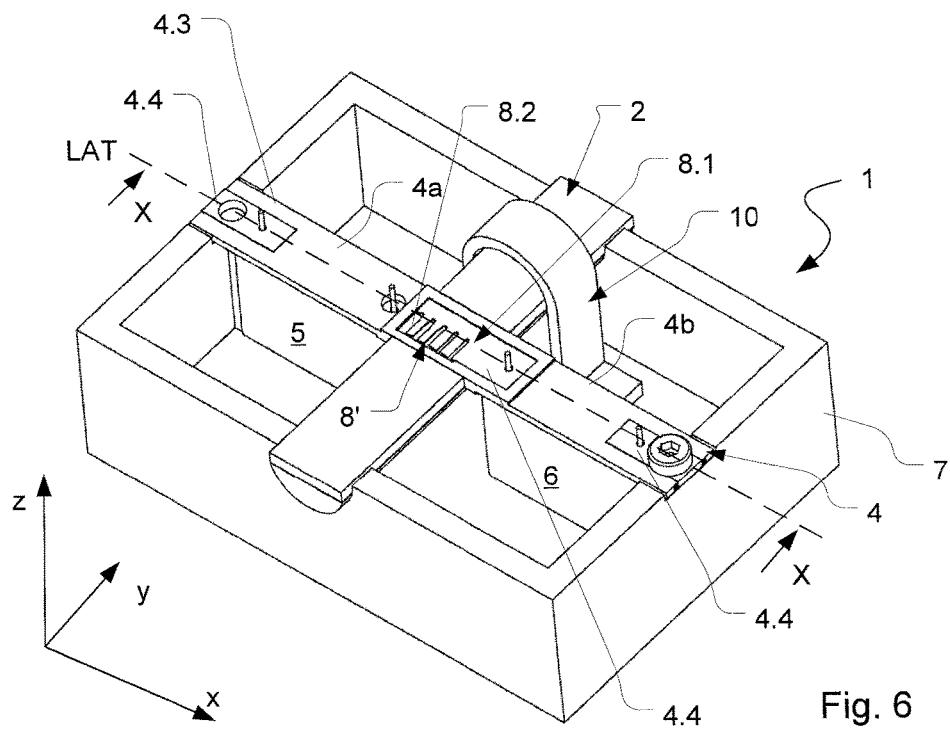
FIG. 6 by way of example, a second embodiment of a filter arrangement in a perspective view.
Figure 7:
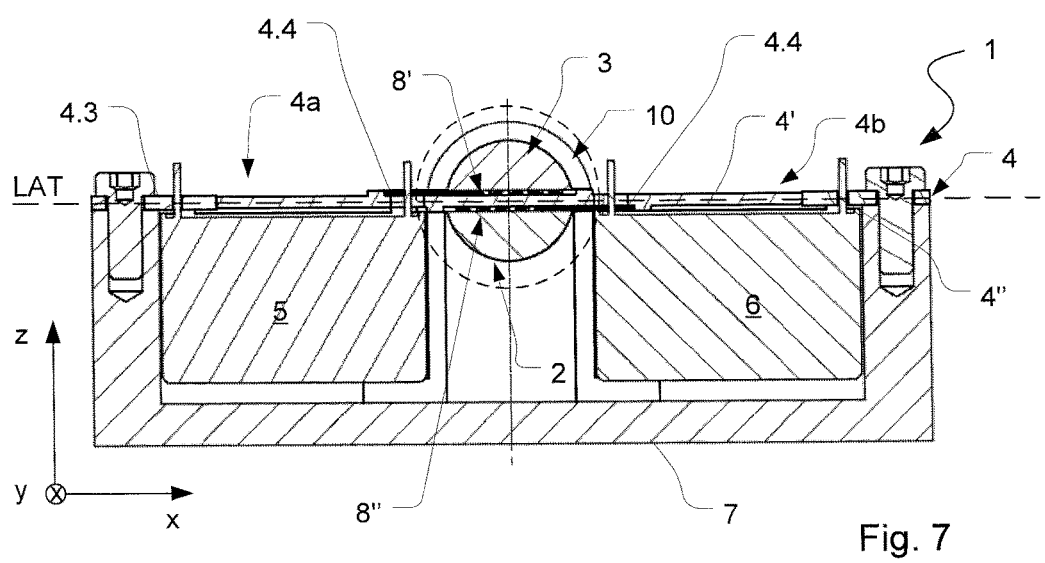
FIG. 7 by way of example, a sectional illustration of the filter arrangement along the section line X-X shown in FIG. 6.
Figure 8:
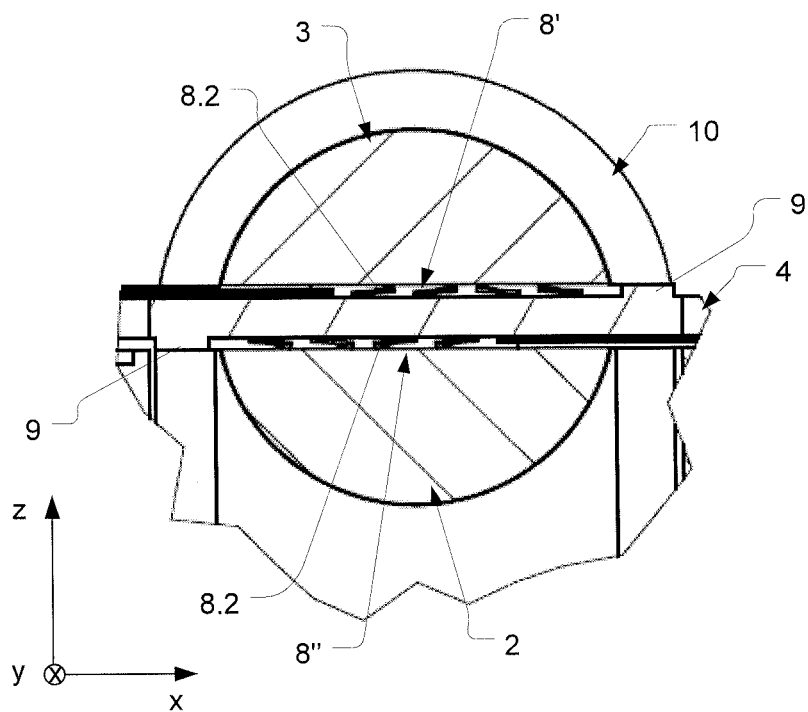
FIG. 8 by way of example, the clamping region, marked by the dashed circle in FIG. 7, between busbar pair and carrier element, in a detail illustration.
Figure 9:
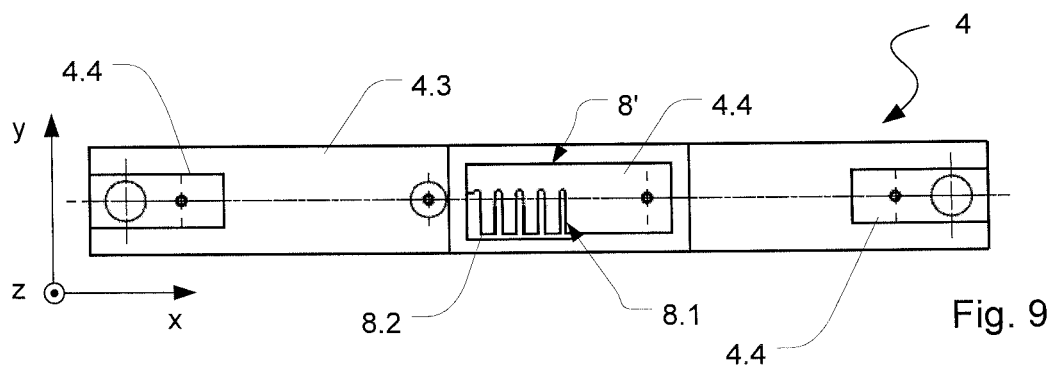
FIG. 9 by way of example, an illustration of the upper side of the carrier element according to the second example embodiment, with capacitors provided thereon.
Figure 10:
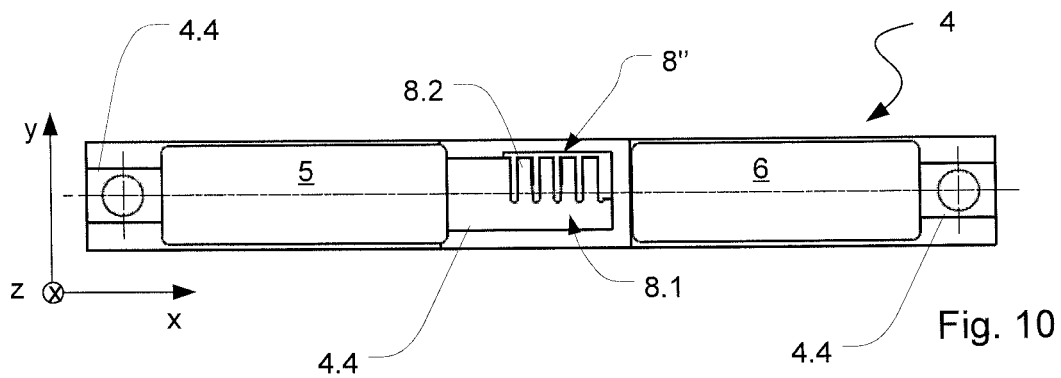
FIG. 10 by way of example, an illustration of the underside of the carrier element according to the second example embodiment, with capacitors provided thereon.

As can be seen in FIGS. 6 and 7, the connection regions of the capacitors 5, 6 can be electrically connected to the punched sheet metal parts 4.4, for example, by soldering in order to guarantee a contacting of the capacitors 5, 6 toward the busbars 2, 3 on the one hand and towards the component 7 on the other hand.

The contact sections 8', 8" can be advantageously formed on the punched sheet metal parts, and namely in particular in one piece. For example, a contact region 8.1 with contact tongues 8.2 can be produced by punching or cutting. Thus in particular the punched sheet metal parts 4.4 have a contact region 8.1 with contact tongues 8.2 electrically connecting the contact regions lying adjacent to the busbars 2, 3, to the busbars 2, 3. Through the one-piece configuration of the contact sections 8', 8", it is achieved that no soldering points are necessary between the contact sections 8', 8" and thereby no transition resistances caused by the soldering sites occur.

As already stated in connection with the first example embodiment, spacers 9 can be provided in the region of the contact sections 8', 8". As can be seen in particular in FIGS. 7 and 8, these can be formed in particular in one piece on the carrier 4.3. Alternatively, the spacers 9 can also be arranged through suitable connecting methods, for example bonding to the carrier 4.3.

Figure 11:
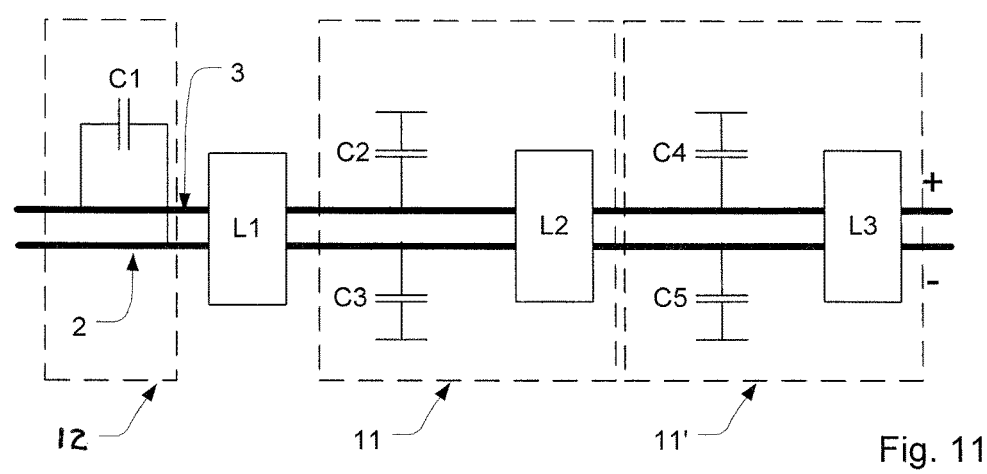
FIG. 11 by way of example, a schematic block diagram of an example filter arrangement for the filtering out of interferences.

FIG. 11 shows by way of example a schematic block diagram of a filter arrangement 1, which can be formed according to the previously described example embodiments. The positive (+) and negative (−) conductor shown in FIG. 11 is formed by the busbars 2, 3. A plurality of capacitors C1 to C5 are connected to these busbars 2, 3 in order to achieve an interference suppression of the busbars 2, 3. The capacitor C1 is electrically connected by a first connection region (Pin) to the first busbar 2 and by the second connection region to the second busbar 3. The capacitor C1 (X-capacitor) forms a so-called differential-mode filter 12 by means of which high-frequency voltage differences between the busbars 2, 3 (push-pull disturbing voltages) are compensated.

The capacitors C2, C3 together with the inductor L2 and the capacitors C4, C5 together with the inductor L3 form so-called common-mode filters 11, 11', respectively, by means of which common-mode interferences, which occur in the same phase at the busbars 2, 3, are filtered out. For this, the capacitors C2 to C5 are connected by a connection region to the reference potential, in particular earth.

The electrical contacting of the capacitors 5, 6 takes place, as previously described, through a mechanical clamping of a carrier element 4 between the busbars 2, 3.

The inductors L1, L2, L3 can be, in particular, mounted onto the busbar pair formed from the busbars 2, 3. The inductors L1, L2, L3 can be, in particular, magnet cores configured in a ring-like manner, consisting of a nanocrystalline strip material. Thereby, the effect of the inductors L1, L2, L3 can be significantly increased.

The magnet cores and the carrier elements 4 having the filter components can be mounted here one after another, in particular alternately one after another, onto the busbar pair, so that a simple mounting of the filter arrangement 1 is possible. The magnet cores can be integrally formed, i.e. not separable.

The invention was described above in example embodiments. It shall be understood that numerous changes and modifications are possible, without thereby departing from the inventive idea on which the invention is based.

It was assumed above that the capacitor 5, 6 is coupled directly to the component 7 situated at reference potential. It shall be understood that—depending on the required filter characteristics—also a plurality of filter components (filter component group) or respectively filter units (with a complex filter structure) can be provided between the busbar and the component 7, which is at reference potential, in order to achieve a desired filter effect. The electrical contacting of this filter component group or respectively of the filter unit in the region of the busbar takes place, however, via the previously described mechanical clamping in the region of the busbars.

REFERENCE LIST 1 filter arrangement
2 first busbar
3 second busbar
4 carrier element
4' upper side
4" underside
4a, 4b carrier element region
4.1 printed circuit board
4.2 conductor path region
4.3 carrier
4.4 punched sheet metal part
5 first capacitor 6 second capacitor
7 component
8', 8" contact section
8.1 contact region
8.2 contact tongues
9 spacer
12 differential-mode filter
11 common-mode filter
LAS longitudinal axis of the busbar
LAT longitudinal axis of the carrier element

The invention claimed is:

1. A filter arrangement comprising:
a housing component having an electrical earth reference potential;
a first busbar;
a second busbar; and
a carrier element arranged between the first busbar and the second busbar and on which at least two electrical filter components are arranged, a first electrical filter component of the at least two electrical filter components is electrically connected to the first busbar and a second electrical filter component of the at least two electrical filter components is electrically connected to the second busbar, wherein an electrical connection of the at least two electrical filter components to a respective one of the first busbar and the second busbar is obtained through a mechanical clamping of the carrier element between the first busbar and the second busbar, wherein the electrical connection between the respective one of the first busbar and the second busbar and a conducting region situated on the carrier element occurs using at least one contact section having at least one contact region configured in a spring-like manner, wherein the first electrical filter component couples the first busbar within the housing component, and wherein the second electrical filter component couples the second busbar within the housing component.

2. The filter arrangement according to claim 1, wherein the first busbar and the second busbar run parallel to one another and are arranged one above the other.

3. The filter arrangement according to claim 1, wherein the carrier element is configured in a strip-shaped manner.

4. The filter arrangement according to claim 1, wherein a longitudinal axis (LAT) of the carrier element runs transversely to longitudinal axes (LAS) of the first busbar and the second busbar.

5. The filter arrangement according to claim 1, wherein the carrier element protrudes laterally on both sides of the first busbar and the second busbar, and the at least two electrical filter components include the first electrical filter component protruding on a first of the both sides of the first busbar and the second busbar and the second electrical filter component protruding on a second of the both sides of the first busbar and the second busbar.

6. The filter arrangement according to claim 1, wherein the at least one contact section comprises a plurality of contact tongues protruding upwards or upwards and downwards.

7. The filter arrangement according to claim 1, wherein a spacer is provided between the carrier element and the respective one of the first busbar and the second busbar in a region of the contact section in a manner limiting deformation of the at least one contact region configured in the spring-like manner.

8. The filter arrangement according to claim 1, wherein the carrier element is a printed circuit board with a plurality of conductor path regions.

9. The filter arrangement according to claim 1, wherein the carrier element has a carrier of an electrically non-conducting material, and punched sheet metal parts arranged on the carrier.

10. The filter arrangement according to claim 9, wherein the at least one contact region is provided in one piece on the punched sheet metal part connecting the respective one of the first busbar and the second busbar to at least one of the first electrical filter component or the second electrical filter component.

* * * * *